(12) United States Patent
Byun

(10) Patent No.: US 11,824,069 B2
(45) Date of Patent: Nov. 21, 2023

(54) IMAGE SENSING DEVICE INCLUDING NOISE BLOCKING STRUCTURES

(71) Applicant: SK hynix Inc., Icheon-si (KR)

(72) Inventor: Kyung Su Byun, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 93 days.

(21) Appl. No.: 17/340,950

(22) Filed: Jun. 7, 2021

(65) Prior Publication Data

US 2022/0157866 A1 May 19, 2022

(30) Foreign Application Priority Data

Nov. 19, 2020 (KR) .......................... 10-2020-0155341

(51) Int. Cl.
*H01L 27/146* (2006.01)
(52) U.S. Cl.
CPC .. *H01L 27/14603* (2013.01); *H01L 27/14623* (2013.01); *H01L 27/14627* (2013.01); *H01L 27/14638* (2013.01)
(58) Field of Classification Search
CPC ......... H01L 27/14603; H01L 27/14623; H01L 27/14627; H01L 27/14638; H01L 27/1462; H01L 27/14609; H04B 10/114; H04N 5/2175; H04N 5/341; H04N 5/379; H04N 25/62; H04N 25/40; H04N 25/79; G01S 7/481; G01S 17/08
See application file for complete search history.

(56) References Cited

U.S. PATENT DOCUMENTS

| | | | | |
|---|---|---|---|---|
| 11,079,476 | B2* | 8/2021 | Imoto | .................. G01S 7/4816 |
| 2020/0219921 | A1* | 7/2020 | Ennoji | ............... H01L 27/1463 |
| 2021/0118929 | A1* | 4/2021 | Yang | ................. H01L 27/14623 |
| 2022/0068983 | A1* | 3/2022 | Yamazaki | .............. G01S 17/46 |
| 2022/0223632 | A1* | 7/2022 | Watanabe | ............. G01S 7/4914 |

FOREIGN PATENT DOCUMENTS

KR 102061467 B1 12/2019

* cited by examiner

*Primary Examiner* — Albert H Cutler
(74) *Attorney, Agent, or Firm* — Perkins Coie LLP

(57) ABSTRACT

An image sensing device is provided to include a pixel array including unit pixels. Each unit pixel includes a substrate including a sensing region that generates charge carriers in response to incident light, first and second signal detectors configured to receive control signals for generating a charge current in the sensing region of the substrate and capture the charge carriers moving by the charge current, a lens layer disposed to direct incident light toward the substrate in the unit pixel, and a noise blocking structures disposed over a peripheral region of the sensing region and underneath the lens and structured to leave space above the sensing region open to allow the incident light from the lens layer to reach the sensing region while shield a peripheral region of the sensing region in the substrate from the incident light.

20 Claims, 14 Drawing Sheets

IMAGE SENSING DEVICE INCLUDING NOISE BLOCKING STRUCTURES

CROSS-REFERENCE TO RELATED APPLICATION

This patent document claims the priority and benefits of Korean patent application No. 10-2020-0155341, filed on Nov. 19, 2020, the disclosure of which is incorporated by reference in its entirety as part of the disclosure of this patent document.

TECHNICAL FIELD

The technology and implementations disclosed in this patent document generally relate to an image sensing device.

BACKGROUND

An image sensing device is a device for capturing optical images by converting light into electrical signals using a photosensitive semiconductor material which reacts to light that is incident thereon to produce an image. With the development of automotive, medical, computer and communication industries, the demand for high-performance image sensing devices has been increasing in various electronic devices such as smart phones, digital cameras, camcorders, personal communication systems (PCSs), game consoles, devices for use with IoT (Internet of Things), robots, surveillance cameras, medical micro cameras, etc.

In order to acquire a three-dimensional (3D) image using the image sensor, color information of the 3D image and the distance (or depth) between a target object and the image sensor are needed.

As an example for acquiring information about the distance between the target object and the image sensor, a Time of Flight (TOF) method has been used. In the case of the TOF method, after light has been emitted from the light source to the target object, a time duration in which light is reflected from the target object and returns to the image sensor. The TOF method may calculate the distance between the target object and the image sensor using the measurement result.

SUMMARY

The embodiments of the disclosed technology relate to an image sensing device for effectively blocking noise introduced into a substrate.

In one aspect of the disclosed technology, an image sensing device is provide to include a pixel array in which a plurality of unit pixels is consecutively arranged. Each of the plurality of unit pixels includes a substrate structured to include a sensing region that generates charge carriers in response to incident light, first and second signal detectors formed in the sensing region of the substrate and configured to receive control signals for generating a charge current in the sensing region of the substrate and capture the charge carriers moving by the charge current, a lens layer disposed over the substrate to direct incident light toward the substrate in the unit pixel, and noise blocking structures disposed over a peripheral region of the sensing region and underneath the lens layer, the noise blocking structures being structured to leave space above the sensing region open to allow the incident light from the lens layer to reach the sensing region while shielding a peripheral region of the sensing region in the substrate from the incident light.

In another aspect of the disclosed technology, an image sensing device is provided to include a pixel array in which a plurality of unit pixels is consecutively arranged, wherein each of the plurality of unit pixels includes: a substrate configured to generate signal carriers in response to incident light; first and second signal detectors formed in the substrate, configured to generate a hole current in the substrate, and to capture the signal carriers moving by the hole current; a lens layer formed over the substrate; and a plurality of noise blocking circuits configured to open a hole-current generation region in which the hole current is generated in the substrate, and to shield a peripheral region of the hole-current generation region in the substrate.

In accordance with another embodiment of the disclosed technology, an image sensing device may include a substrate in which signal carriers are generated in response to incident light, first and second signal detectors spaced apart from each other by a predetermined distance in a first direction within the substrate, the first and second signal detectors configured to receive control signal for generating a current in the substrate, and capture the signal carriers moving by the current, and first and second noise blocking structures formed over the substrate to be spaced apart from each other by a predetermined distance in a second direction perpendicular to the first direction. The first and second noise blocking structures may shield regions on both sides of each of the first and second signal detectors in the second direction. Regions on both sides of each of the first and second signal detectors in the first direction are exposed by the first and second noise blocking structures.

It is to be understood that both the foregoing general description and the following detailed description of the disclosed technology are illustrative and explanatory and are intended to provide further explanation of the disclosure as claimed.

BRIEF DESCRIPTION OF THE DRAWINGS

The above and other features and beneficial aspects of the disclosed technology will become readily apparent with reference to the following detailed description when considered in conjunction with the accompanying drawings.

DETAILED DESCRIPTION

Some implementations of the disclosed technology suggest designs of an image sensing device capable of improving the accuracy of data sensing by blocking noise introduced into the substrate in a Current-Assisted Photonic Demodulator (CAPD) pixel structure.

Hereafter, various embodiments will be described with reference to the accompanying drawings. However, it should be understood that the present disclosure is not limited to specific embodiments, but includes various modifications, equivalents and/or alternatives of the embodiments. The embodiments of the present disclosure may provide a variety of effects capable of being directly or indirectly recognized through the present disclosure.

Figure 1:
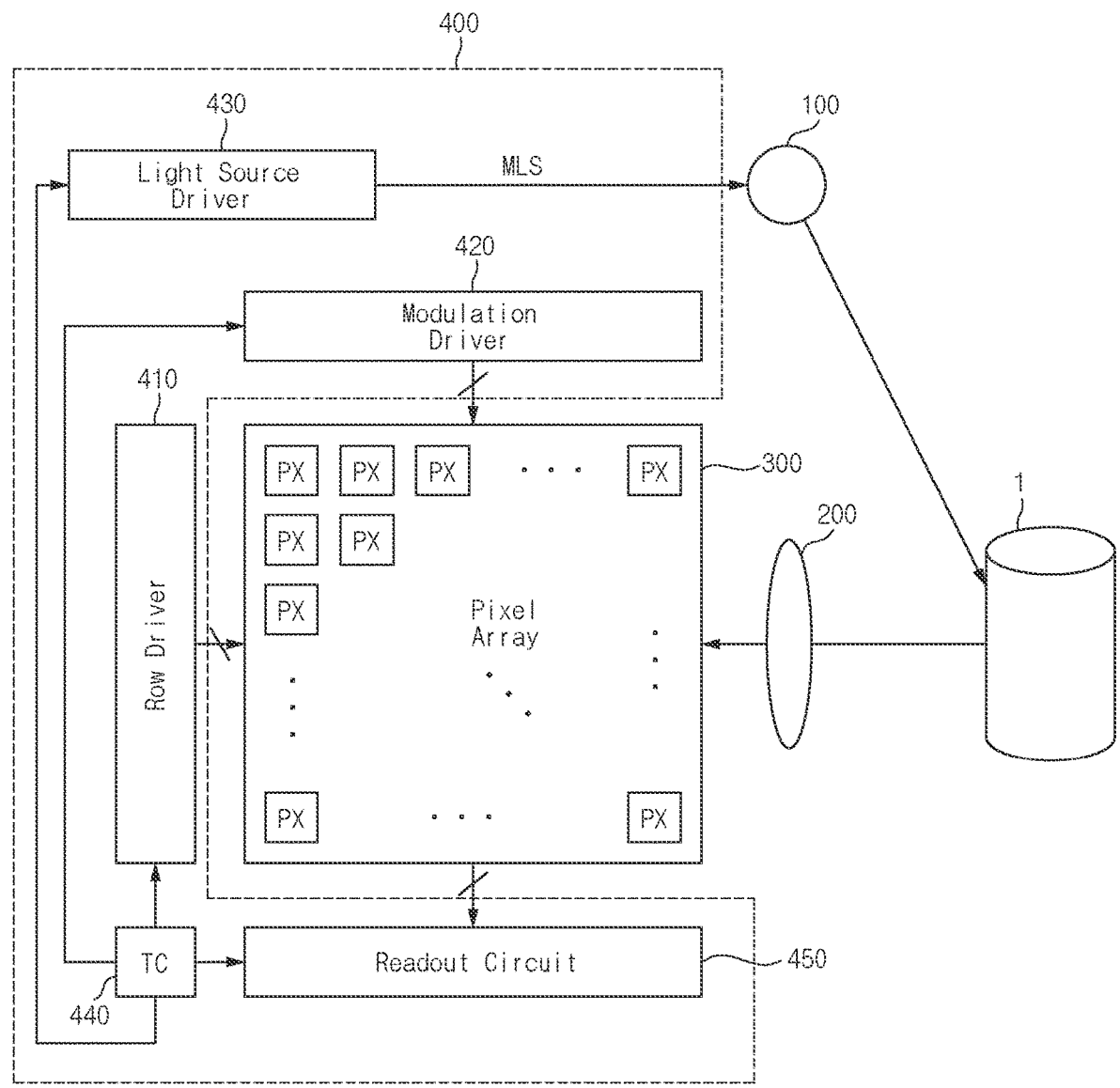
FIG. 1 is a block diagram illustrating an example of an image sensing device based on some embodiments of the disclosed technology.

FIG. 1 is a block diagram illustrating an example of an image sensing device based on some implementations of the disclosed technology.

Referring to FIG. 1, the image sensing device may measure the distance using the Time of Flight (TOF) technique. The image sensing device may include a light source 100, a lens module 200, a pixel array 300, and a control circuit 400.

The light source 100 may emit light to a target object 1 upon receiving a clock signal MLS (modulated light signal) from the control circuit 400. The light source 100 may be a laser diode (LD) or a light emitting diode (LED) for emitting infrared light or visible light, or may be any one of a Near Infrared Laser (NIR), a point light source, a monochromatic light source combined with a white lamp or a monochromator, and a combination of other laser sources. For example, the light source 100 may emit infrared light having a wavelength of 800 nm to 1000 nm. Although FIG. 1 shows only one light source 100 for convenience of description, the scope or spirit of the disclosed technology is not limited thereto, and a plurality of light sources may also be arranged in the vicinity of the lens module 200.

The lens module 200 may collect light reflected from the target object 1, and may allow the collected light to be focused onto pixels (PXs) of the pixel array 300. The lens module 200 may include a focusing lens having a surface formed of or including glass, plastic or other cylindrical optical elements. The lens module 200 may include a focusing lens having a convex structure.

The pixel array 300 may include unit pixels (PXs) consecutively arranged in a two-dimensional (2D) structure in which unit pixels are arranged in a column direction and in a row direction perpendicular to the column direction. The unit pixels (PXs) may convert light received through the lens module 200 into an electrical signal corresponding to the received light such that each unit pixel can output a pixel signal. In this case, the pixel signal may be a signal for indicating a time delay based on the distance to the target object 1, instead of indicating a signal indicating a color of the target object 1. Each unit pixel (PX) may be a Current-Assisted Photonic Demodulator (CAPD) pixel for detecting signal carriers (e.g., electrons) generated in a substrate by incident light using a difference between potential levels of an electric field. For example, each unit pixel (PX) may include a detection region for detecting signal carriers (e.g., electrons) generated by incident light, and a control region for generating a hole current directing electrons to the detection region within the substrate. In particular, each unit pixel (PX) may include a shielding structure for blocking noise components other than light reflected from the target object 1. The structure and operations of each unit pixel (PX) will hereinafter be described with reference to the drawings from FIG. 2.

The control circuit 400 may emit light to the target object 1 by controlling the light source 100, may process each pixel signal corresponding to light reflected from the target object 1 by driving unit pixels (PXs) of the pixel array 300, and may measure a time delay based on the distance to the surface of the target object 1.

The control circuit 400 may include a row driver 410, a modulation driver 420, a light source driver 430, a timing controller 440, and a readout circuit 450.

The row driver 410 and the demodulation driver 420 may be generically called a control circuit for convenience of description.

The control circuit may drive unit pixels (PXs) of the pixel array 300 in response to a timing signal generated from the timing controller 440. The control circuit may generate a control signal capable of selecting and controlling at least one row line from among the plurality of row lines. The control signal may include a demodulation control signal for generating a hole current in the substrate, a reset signal for controlling a reset transistor, a transmission (Tx) signal for controlling transmission of photocharges accumulated in a detection node, a boosting signal for providing additional electrostatic capacity, a selection signal for controlling a selection transistor, and the like. In this case, the row driver 410 may generate a reset signal, a transmission (Tx) signal, a boosting signal, and a selection signal, and the demodulation driver 420 may generate a demodulation control signal.

The light source driver 430 may generate a modulated light signal MLS capable of driving the light source 100 in response to a control signal from the timing controller 440. The modulated light signal MLS may be a signal that is modulated by a predetermined frequency.

The timing controller 440 may generate a timing signal to control the row decoder 410, the modulation driver 420, the light source driver 430, and the readout circuit 450.

The readout circuit 450 may process pixel signals received from the pixel array 430 under control of the timing controller 430, and may thus generate pixel data formed in a digital signal form. To this end, the readout circuit 450 may include a correlated double sampler (CDS) circuit for performing correlated double sampling (CDS) on the pixel signals generated from the pixel array 300. In addition, the readout circuit 450 may include an analog-to-digital converter (ADC) for converting output signals of the CDS circuit into digital signals. In addition, the readout circuit 450 may include a buffer circuit that temporarily stores pixel data generated from the analog-to-digital converter (ADC) and outputs the pixel data under control of the timing controller 440. In the meantime, the pixel array 300 includes Current-Assisted Photonic Demodulator (CAPD) pixels. Therefore, two column lines for transmitting the pixel signal may be assigned to each column of the pixel array 300, and structures for processing the pixel signal generated from each column line may be configured to correspond to the respective column lines.

The light source 100 may emit light (i.e., modulated light) modulated by a predetermined frequency to a target object 1. The pixel array 300 may sense modulated light (i.e., incident light) reflected from the target objects 1, and may thus generate depth information for each unit pixel (PX). A time delay based on the distance between the image sensing device and each target object 1 may occur between the modulated light and the incident light. The time delay may be denoted by a phase difference between the signal generated by the image sensing device and the modulated light signal MLS controlling the light source 100. An image processor (not shown) may calculate a phase difference generated in the output signal of the image sensing device, and may thus generate a depth image including depth information for each unit pixel (PX).

Figure 2:
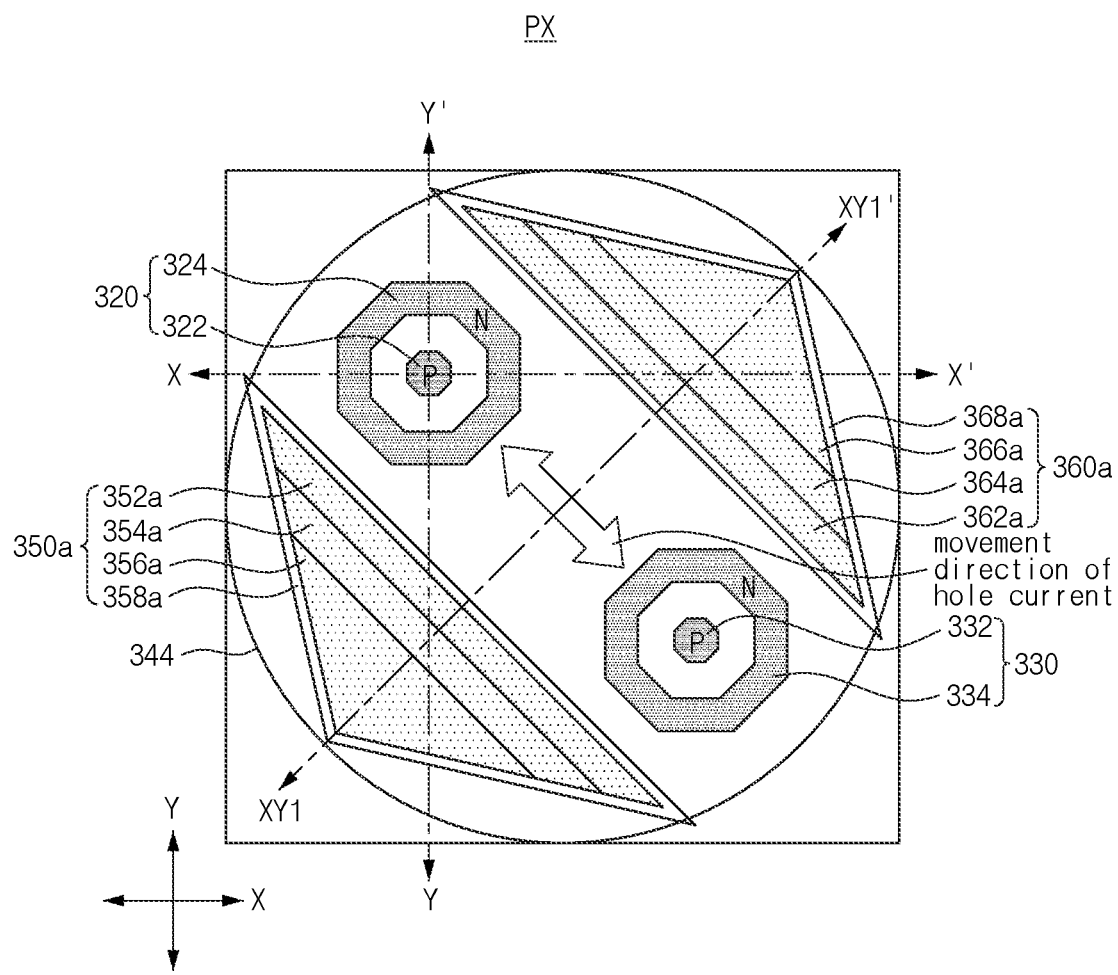
FIG. 2 is a plan view illustrating an example of any one unit pixel formed in a pixel array shown in FIG. 1 based on an embodiment of the disclosed technology.
Figure 3A:
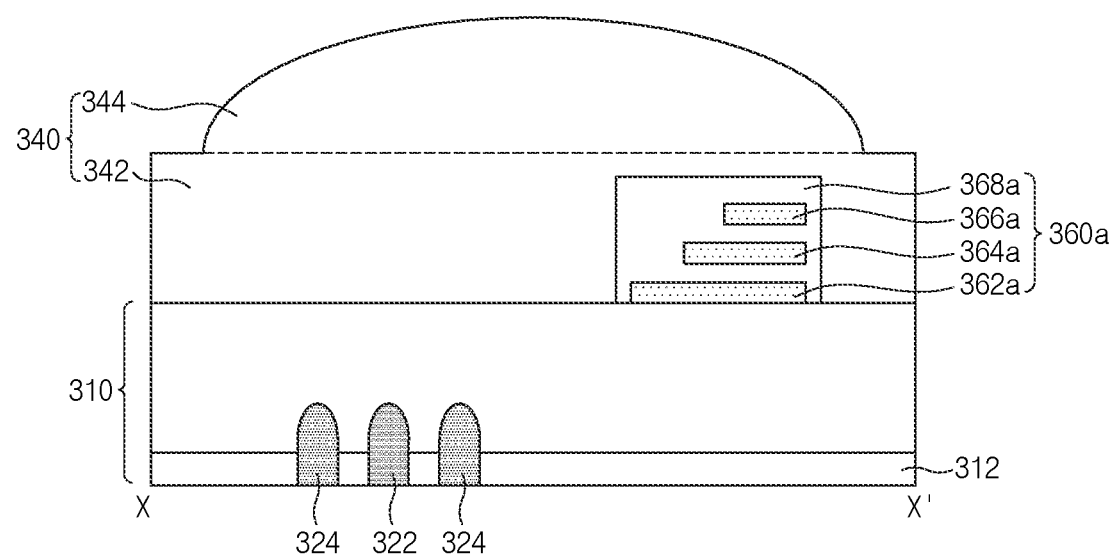
FIG. 3A is a cross-sectional view illustrating an example of a unit pixel taken along the line X-X' shown in FIG. 2 based on some implementations of the disclosed technology.
Figure 3B:
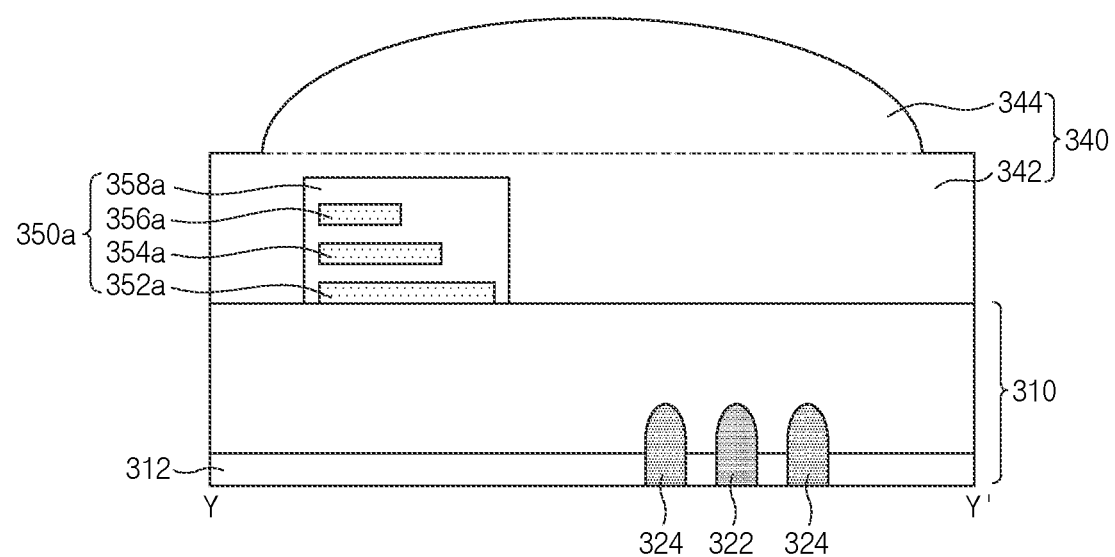
FIG. 3B is a cross-sectional view illustrating an example of a unit pixel taken along the line Y-Y' shown in FIG. 2 based on some implementations of the disclosed technology.
Figure 3C:
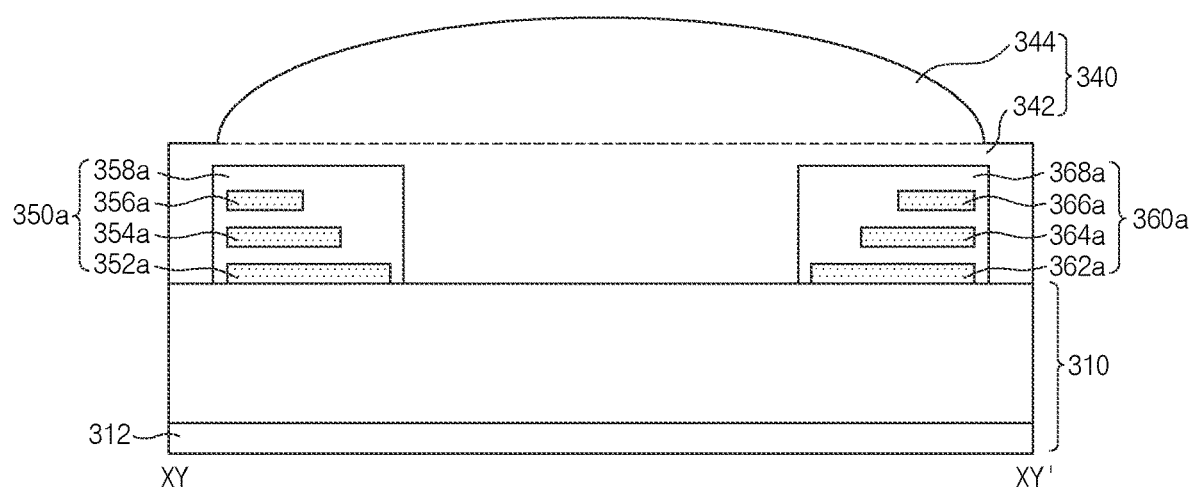
FIG. 3C is a cross-sectional view illustrating an example of a unit pixel taken along the line XY1-XY1' shown in FIG. 2 based on some implementations of the disclosed technology.

FIG. 2 is a plan view illustrating any one unit pixel formed in the pixel array shown in FIG. 1. FIG. 3A is a cross-sectional view illustrating the unit pixel taken along the line X-X' shown in FIG. 2. FIG. 3B is a cross-sectional view illustrating the unit pixel taken along the line Y-Y' shown in FIG. 2. FIG. 3C is a cross-sectional view illustrating the unit pixel taken along the line XY1-XY1' shown in FIG. 2. While FIG. 2 illustrates only one pixel PX for convenience of description, the substantially same structure and operation can be applied to any pixels (PXs) contained in the pixel array 300.

Referring to FIGS. 2, 3A, 3B, and 3C, each unit pixel (PX) may include a substrate 310, a first signal detector 320, a second signal detector 330, a lens layer 340, a first noise blocking structure 350a, and a second noise blocking structure 360a.

The substrate 310 may include a semiconductor substrate, for example, a P-type semiconductor substrate. The substrate 310 may include a first surface upon which reflected light is incident and a second surface facing or opposite to the first surface.

The first signal detector 320 and the second signal detector 330 may be formed in the substrate 310 and extend from the second surface of the substrate 310 to the inside of the substrate 310. The first signal detector 320 and the second signal detector 330 may be disposed at both sides of the center portion of the pixel (PX) in a diagonal direction of the pixel (PX). The first signal detector 320 and the second signal detector 330 may be arranged to face each other with respect to the center portion of the pixel (PX). In this case, the first signal detector 320 and the second signal detector 330 may be disposed along a diagonal direction and a hole current between the first signal detector 320 and the second signal detector 330 may flow along the diagonal direction. In this way, a separation distance between the first signal detector 320 and the second signal detector 330 that are arranged in the diagonal direction may be longer than a separation distance between the first signal detector 320 and the second signal detector 330 that are arranged in an X-axis or Y-axis direction. As a result, the size of the region in which a hole current is generated increases, which makes more signal carriers (e.g., electrons) introduced to the signal detectors 320 and 330.

Although FIG. 2 illustrates that the first signal detector 320 and the second signal detector 330 are arranged in the diagonal direction (e.g., a first diagonal direction) passing through a vertex at a left upper portion of the pixel (PX) and a vertex at a right lower portion of the pixel (PX), other implementations are also possible. For example, the first signal detector 320 and the second signal detector 330 can also be arranged in another diagonal direction (e.g., a second diagonal direction) perpendicular to the first diagonal direction.

The first signal detector 320 may include a control region 322 and a detection region 324. The second signal detector 330 may include a control region 332 and a detection region 334.

Each of the control regions 322 and 332 may include a P-type impurity region. For example, each of the control regions 322 and 332 may include a $P^+$ diffusion region and a $P^-$ well region. The control regions 322 and 332 may be coupled to the modulation driver 420 through conductive lines, and may receive a modulation control signal from the modulation driver 420. For example, different control voltages serving as demodulation control signals may be applied to the control regions 322 and 332. Voltage levels to be applied to the control regions 322 and 332 may be periodically interchanged with each other. A hole current may occur in the substrate 310 by a potential difference between the control regions 322 and 332. Signal carriers (e.g., electrons) generated in the substrate 310 by incident light may move toward the first signal detector 320 or the second signal detector 330 by the hole current in a direction opposite to the movement direction of the hole current. Thus, movement of signal carriers may be controlled by a hole current generated by the control regions 322 and 332.

Each of the detection regions 324 and 334 may include an N-type impurity region. For example, each of the detection regions 324 and 334 may include an $N^+$ diffused region and an $N^-$ well region. When signal carriers generated in response to light incident upon the substrate 310 through the lens layer 340 are moved by a hole current, each of the detection regions 324 and 334 may capture the signal carriers and accumulate the captured signal carriers. The same level of voltage may be applied to the detection regions 324 and 334. In this case, the same level of voltage may be set to a level between the voltage levels that are respectively applied to the control regions 322 and 332 to generate a hole current.

In each of the first signal detector 320 and the second signal detector 330, the detection region 324 may be formed to surround the control region 322, and the detection region 334 may be formed to surround the control region 332. Since the detection regions 324 and 334 are formed to surround the control regions 322 and 332, the detection regions 324 and 334 can more easily capture signal carriers that move toward the control regions 322 and 332 by the hole current.

Although FIG. 2 illustrates an example that each of the detection regions 324 and 334 is formed in an octagonal ring shape, the shape(s) of the detection regions 324 and 334 can be changed. For example, the detection region 324 or the detection region 334 can be formed in a circular or polygonal shape. In addition, the detection region 324 or the detection region 334 may be formed not in a shape of a continuous ring that completely encloses the corresponding control region 322 or 332, but in a shape of a ring separated at least some portion.

In some implementations, a device isolation layer 312 is provided to isolate an active region in which the control regions 322 and 332 are formed from an active region in which the detection regions 324 and 334 are formed. The device isolation layer 312 may be formed in a Shallow Trench Isolation (STI) shape in which an insulation material is buried in a trench formed by etching the second surface of the substrate 310 to a predetermined depth. For example, the device isolation layer 312 may include an oxide film.

The lens layer 340 may be formed over the first surface of the substrate 310. The lens layer 340 may converge incident light from outside, and may enable the converged light to be incident upon the substrate 310. The lens layer 340 may include an over-coating layer 342 and a microlens 344. A top surface of the over-coating layer 342 may be evenly formed over the first surface of the substrate 310. The microlens 344 may be formed over the over-coating layer 342, and a top surface of the microlens 344 is formed to have a curvature. The over-coating layer 342 may operate as a planarization layer. Each of the microlenses 344 may be formed in a hemispherical shape, and may be formed per unit pixel (PX). The over-coating layer 342 and the microlenses 344 may be formed of or include the same materials. For example, each of the over-coating layer 342 and the microlens 344 may be formed of a photoresist material.

The first noise blocking structure 350a and the second noise blocking structure 360a may be formed over the first surface of the substrate 310. For example, the first noise blocking structure 350a and the second noise blocking structure 360a may be embedded in the over-coating layer 342 of the lens layer 340.

In each unit pixel (PX), each of the first noise blocking structure 350a and the second noise blocking structure 360a may be formed to open a hole-current generation region to receive incident light while blocking light from entering other regions in the pixel. In the example shown in FIG. 2, the region over which the first noise blocking structure 350a and the second noise blocking structure 360a are positioned is a peripheral region of the hole-current generation region and the first noise blocking structure 350a and the second noise blocking structure 360a may shield or blocking the peripheral region of the hole-current generation region. The hole-current generation region may include both sides of the first signal detector 320 that are disposed along the first diagonal direction and both sides of the second signal detector 330 that are disposed along the first diagonal direction. Referring to FIG. 2, the hole-current generation region may include the central portion of the unit pixel and the adjacent regions to the central portion of the unit pixel. The adjacent regions are disposed along the first diagonal direction and the first signal detector 320 and the second signal detector 330 are disposed in the adjacent regions. The peripheral region of the hole-current generation region may include a region around a vertex at a left lower portion of the pixel (PX) and another region around a vertex at a right upper portion of the pixel (PX). Thus, for example, the first noise blocking structure 350a and the second noise blocking structure 360a may be formed to open or expose regions including the first signal detector 320, the second signal detector 330 and the central portion and shield regions disposed both sides of the hole-current generation region. The first noise blocking structure 350a and the second noise blocking structure 360a may be spaced apart from each other by a predetermined distance while facing away from each other in the second diagonal direction perpendicular to a movement direction of the hole current. In this case, the first noise blocking structure 350a and the second noise blocking structure 360a may be symmetrical to each other in the second diagonal direction.

When light emitted from the light source 100 is reflected from the target object 1 and the reflected light returns to the pixel, the returned light includes noise components, and such noise components may generally occur by diffuse reflection of light or background light. The implementations of the disclosed technology suggest the first noise blocking structure 350a and the second noise blocking structure 360a that expose or open the hole-current generation region while shielding the peripheral region of the hole-current generation region, thereby minimizing an introduction of light that is likely to have noise components into the substrate 310.

The first noise blocking structure 350a may include a plurality of shielding layers 352a, 354a, and 356a stacked in a vertical direction (i.e., a height direction), and a capping layer 358a formed to cover the shielding layers 352a, 354a, and 356a. The shielding layers 352a, 354a, and 356a may be stacked one another and the shielding layers 352a, 354a, and 356a may be structured to gradually reduce in size in an upward direction from the substrate 310 with the signal detectors 320 and 330 towards the lens layer 340 which directs light into a light sensing region in the substrate. The light sensing region may include the hole-current generation region. Each of the shielding layers 352a, 354a, and 356a has an inner sidewall and an outer sidewall. The outer sidewalls of the shielding layers 352a, 354a, and 356a are aligned one another. Since the width of the shielding layers 352a, 354a, and 356a are different from one another, the inner sidewalls of the shielding layer 352a, 354a, and 356a are not aligned. Referring to FIGS. 3B and 3C, the inner sidewalls of the shielding layer 352a, 354a, and 356a are in an order in a direction further away from the center of the unit pixel (PX). Each of the shielding layers 352a, 354a, and 356a may include a material capable of absorbing light. The capping layer 358a may be formed between the shielding layers 352a, 354a, and 356a.

The second noise blocking structure 360a may include a plurality of shielding layers 362a, 364a, and 366a stacked in the height direction, and a capping layer 368a formed to cover the shielding layers 362a, 364a, and 366a.

The shielding layers 362a, 364a, and 366a may be symmetrical to the shielding layers 352a, 354a, and 356a in the second diagonal direction. The shielding layers 362a, 364a, and 366a may be stacked one another and the shielding layers 362a, 364a, and 366a are gradually reduced in size in an upward direction. Each of the shielding layers 362a, 364a, and 366a has an inner sidewall and an outer sidewall. The outer sidewalls of the shielding layers 362a, 364a, and 366a are aligned one another. Since the width of the shielding layers 362a, 364a, and 366a are different from one another, the inner sidewalls of the shielding layer 362a, 364a, and 366a are not aligned. Referring to FIGS. 3A and 3C, the inner sidewalls of the shielding layer 362a, 364a, and 366a are in an order in a direction further away from the center of the unit pixel (PX).

The shielding layers 362a, 364a, and 366a may be formed of or include the same material. The capping layer 368a may be formed between the shielding layers 362a, 364a, and 366a.

The capping layers 358a and 368a may enable light beams incident between the first noise blocking structure 350a and the second noise blocking structure 360a to be easily introduced into the hole-current generation region within the substrate 310. For example, each of the capping layers 358a and 368a may be formed of a material having a refractive index different from that of the lens layer 340. Light obliquely incident between the first noise blocking structure 350a and the second noise blocking structure 360a may be reflected by the capping layers 358a and 368a, such that the reflected light can be well introduced into the hole-current generation region within the substrate 310. Each of the capping layers 358a and 368a may include an oxide film.

Although it has been described that the first noise blocking structure 350a includes the plurality of shielding layers 352a, 354a, and 356a that are stacked in the height direction and the second noise blocking structure 360a includes the plurality of shielding layers 362a, 364a, and 366a that are stacked in the height direction, other implementations are also possible. For example, the first noise blocking structure 350a may include only one shielding layer 352a and the second noise blocking structure 360a may include only one shielding layer 362a.

Figure 4:
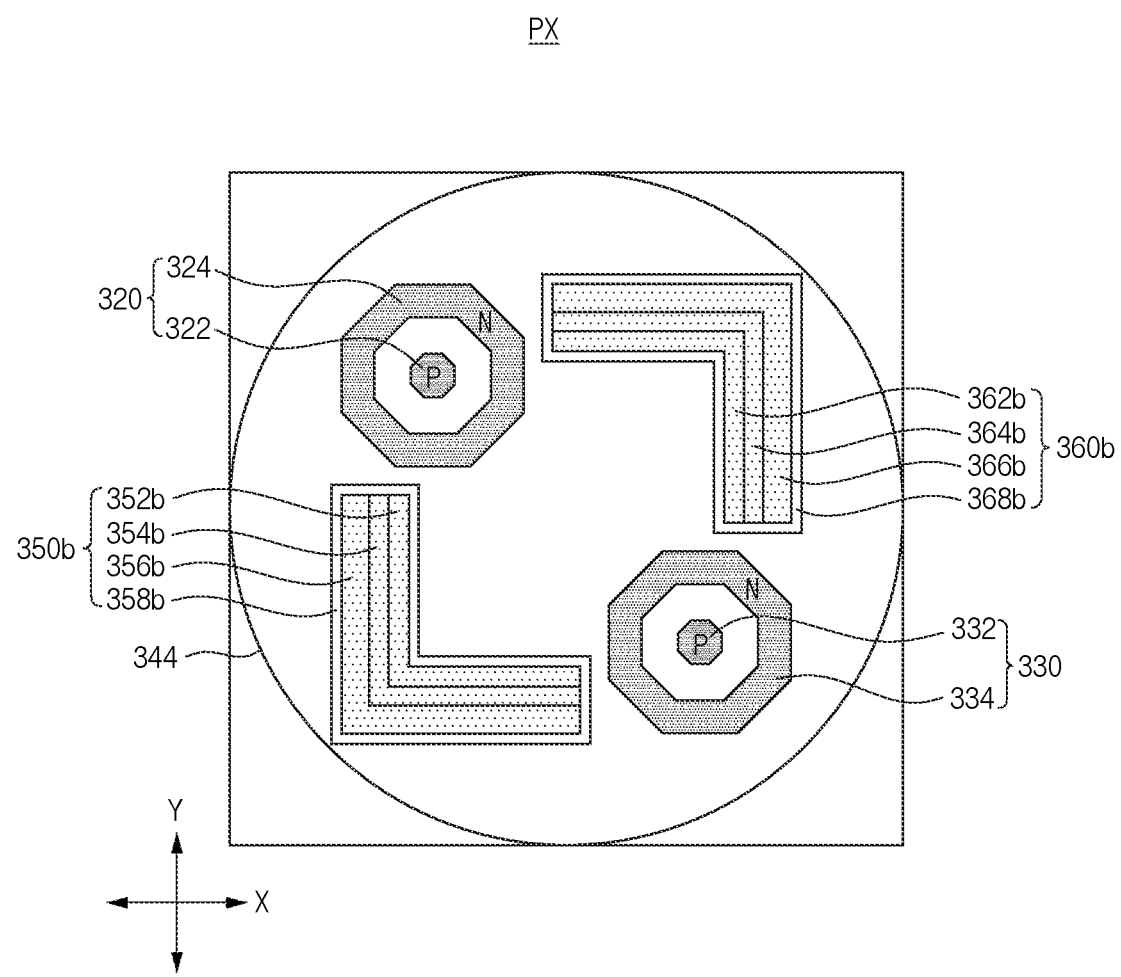
FIG. 4 is a plan view illustrating an example of a unit pixel formed in a pixel array shown in FIG. 1 based on another embodiment of the disclosed technology.
Figure 5:
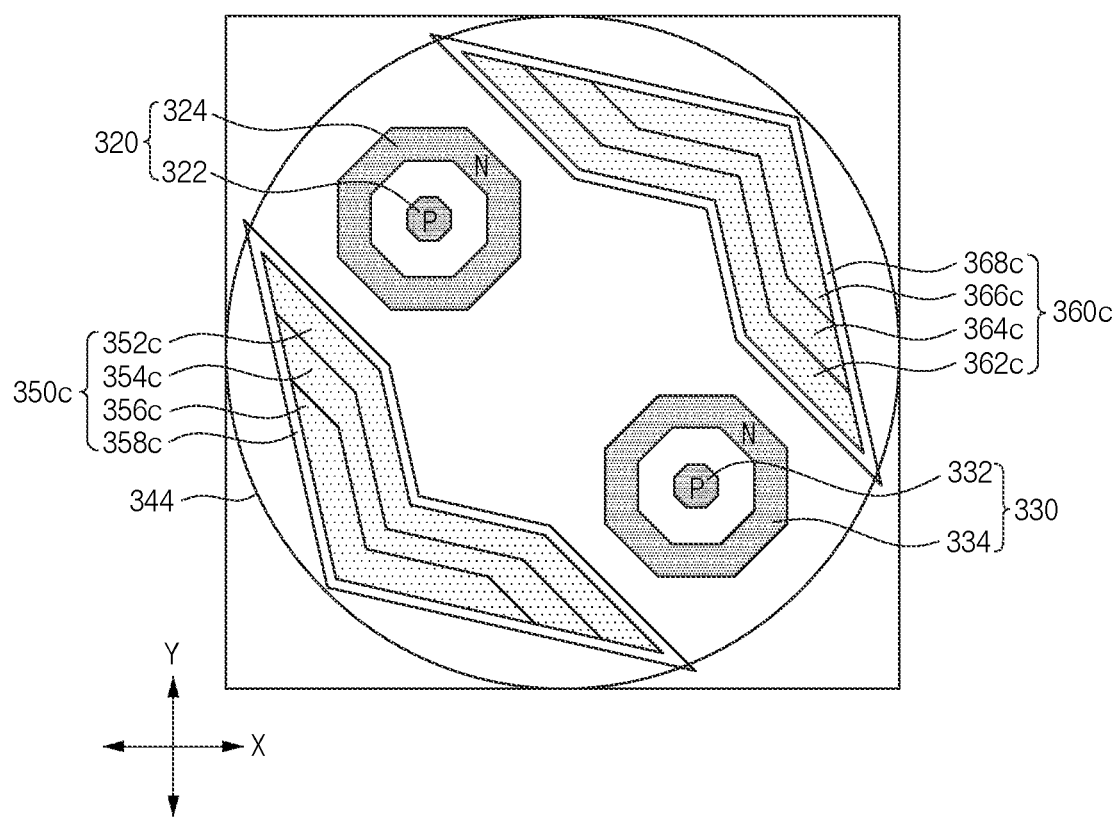
FIG. 5 is a plan view illustrating an example of a unit pixel formed in a pixel array shown in FIG. 1 based on another embodiment of the disclosed technology.

FIGS. 4 and 5 are plan views illustrating the unit pixels formed in the pixel array shown in FIG. 1 based on other embodiments of the disclosed technology.

Referring to FIGS. 4 and 5, each of the first noise blocking structures 350b and 350c and each of the second noise blocking structures 360b and 360c have a non-straight shape. Non-straight shape of each of the first noise blocking structures 350b and 350c and each of the second noise blocking structures 360b and 360c increases a region between the noise blocking structures facing each other, the region disposed in a direction (e.g., the second diagonal direction) perpendicular to the movement. Thus, each of the first noise blocking structures 350b and 350c and each of the second noise blocking structures 360b and 360c does not extend in a straight line in the movement direction of the hole current. Although FIG. 4 exemplarily illustrates that each of the first noise blocking structure 350b and the second noise blocking structure 360b is bent at an angle of 90°, other implementations are also possible. For example, each of the first noise blocking structure 350b and the second noise blocking structure 360b can also be formed in a curved shape. Although FIG. 5 exemplarily illustrates that each of the first noise blocking structure 350c and the second noise blocking structure 360c is bent at an angle of more than 90°, the scope or spirit of the disclosed technology is not limited thereto, and each of the first noise blocking structure 350c and the second noise blocking structure 360c can also be formed in a curved shape.

The first noise blocking structures 350b and 350c and the second noise blocking structures 360b and 360c can more widely open the hole-current generation region than the first noise blocking structure 350a and the second noise blocking structure 360a shown in FIG. 3.

Each of the first noise blocking structures 350b and 350c may be formed in a stacked shape in which the shielding layers 352b~356b and the shielding layers 352c~356c are gradually reduced in size in an upward direction. The capping layer 358b may be formed to cover the shielding layers 352b~356b and the capping layer 358c may be formed to cover the shielding layers 352c~356c. Each of the second noise blocking structures 360b and 360c may be formed in a stacked shape in which the shielding layers 362b~366b and the shielding layers 362c~366c are gradually reduced in size in an upward direction. The capping layer 368b may be formed to cover the shielding layers 362b~366b and the capping layer 368c may be formed to cover the shielding layers 362c~366c.

The bent angle or curved degree of each of the first noise blocking structures 350b and 350c or each of the second noise blocking structures 360b and 360c can be adjusted as needed. In addition, the width of each of the first noise blocking structures 350b and 350c and the width of each of the second noise blocking structures 360b and 360c can be adjusted as needed, such that the first noise blocking structures 350b and 350c and the second noise blocking structures 360b and 360c can more widely shield the peripheral region of the hole-current generation region.

Figure 6:
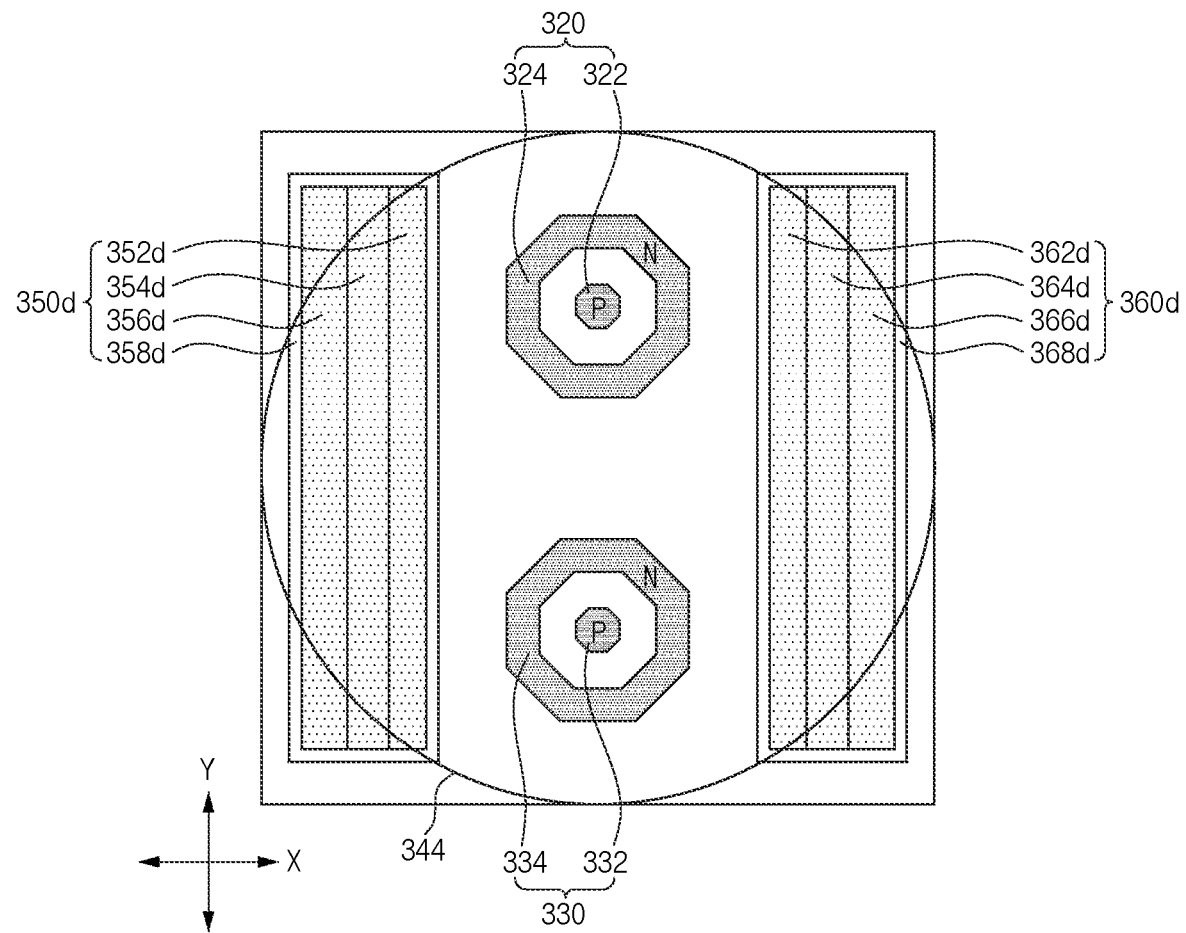
FIG. 6 is a plan view illustrating an example of a unit pixel formed in a pixel array shown in FIG. 1 based on another embodiment of the disclosed technology.

FIG. 6 is a plan view illustrating an example of the unit pixel formed in the pixel array shown in FIG. 1 based on another embodiment of the disclosed technology.

Referring to FIG. 6, the first signal detector 320 and the second signal detector 330 may be arranged to face each other at both sides of the center portion of each pixel (PX) in a Y-axis direction. In this case, the movement direction of the hole current may be set to the Y-axis direction. The first signal detector 320 and the second signal detector 330 may be arranged opposite to each other in an X-axis direction.

When the first signal detector 320 and the second signal detector 330 are arranged in the X-axis or Y-axis direction, each of the first noise blocking structure 350d and the second noise blocking structure 360d may be formed in a rectangular shape extending in the same direction as the movement direction of the hole current when viewed in a plane. For example, each of the first noise blocking structure 350d and the second noise blocking structure 360d may be formed in a rectangular shape in the direction perpendicular to the movement direction of the hole current. The first noise blocking structure 350d and the second noise blocking structure 360d may be disposed at both sides of the first signal detector 320 and the second signal detector 330.

The first noise blocking structure 350d may include a plurality of shielding layers 352d~356d having different sizes, and a capping layer 358d formed to cover the shielding layers 352d~356d. The second noise blocking structure 360d may include a plurality of shielding layers 362d~366d having different sizes, and a capping layer 368d formed to cover the shielding layers 362d~366d. In this case, the shielding layers 352d~356d may be stacked in the height direction, and the shielding layers 362d~366d may be stacked in the height direction.

Even when the first signal detector 320 and the second signal detector 330 are arranged to face each other in the X-axis or Y-axis direction, the noise blocking structures may be constructed in a manner that the inner sidewalls thereof are bent or curved to open the hole-current generation region more widely.

Figure 7:
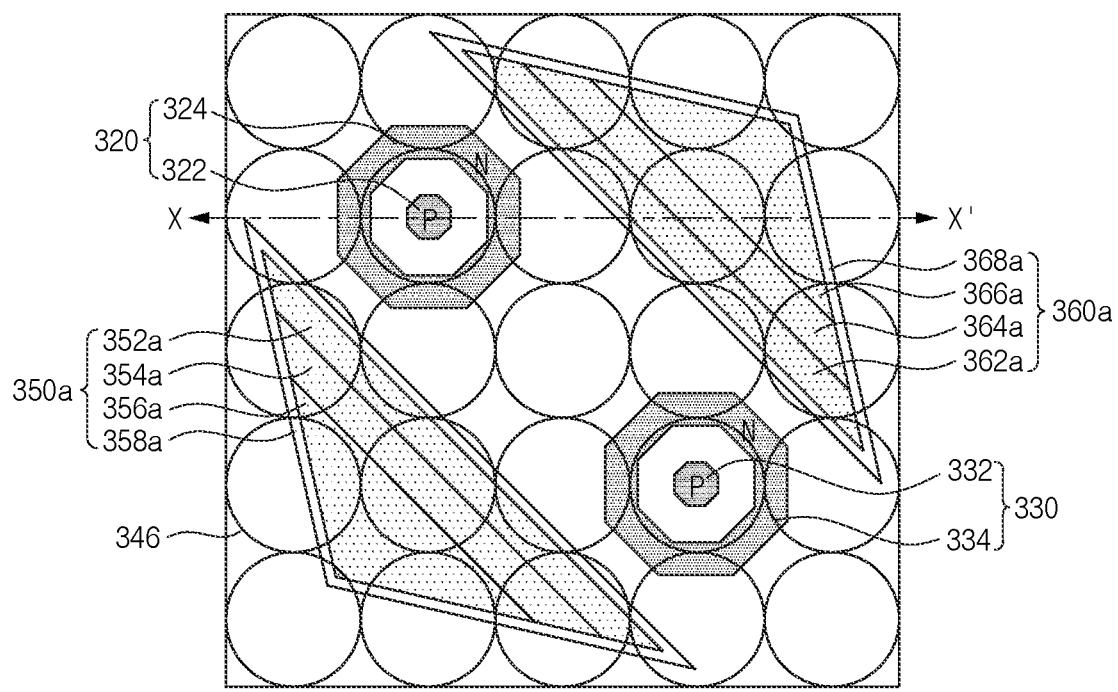
FIG. 7 is a plan view illustrating an example of a unit pixel formed in a pixel array shown in FIG. 1 based on still another embodiment of the disclosed technology.
Figure 8:
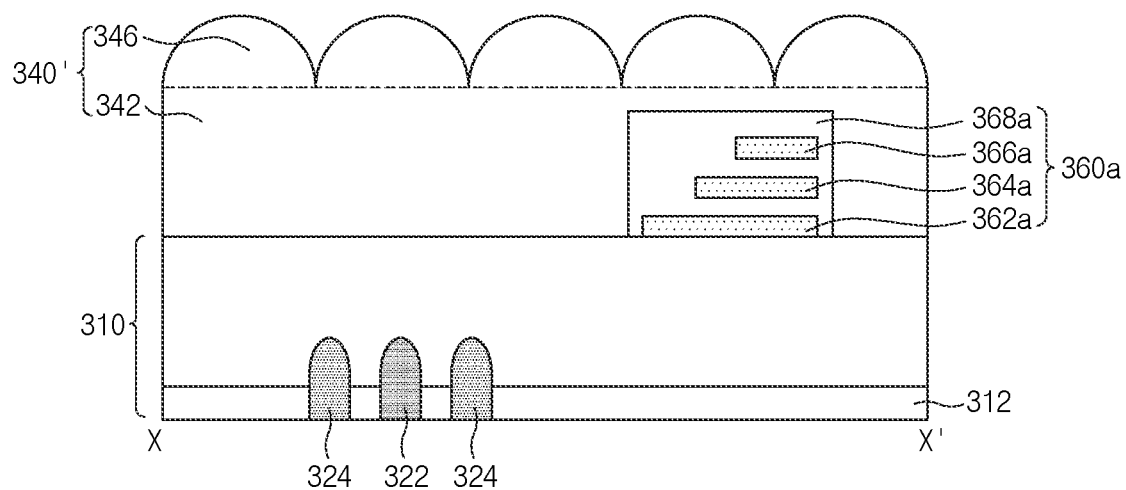
FIG. 8 is a cross-sectional view illustrating an example of a unit pixel taken along the line X-X' shown in FIG. 7 based on some implementations of the disclosed technology.

FIG. 7 is a plan view illustrating an example of the unit pixel formed in the pixel array shown in FIG. 1 based on still another embodiment of the disclosed technology. FIG. 8 is a cross-sectional view illustrating an example of the unit pixel taken along the line X-X' shown in FIG. 7.

In comparison with FIGS. 2 and 3A, a lens layer 340' of each unit pixel (PX) may include a plurality of microlenses 346. That is, the plurality of microlenses 346 may be formed over an over-coating layer 342.

As described above, in each pixel (PX), different microlenses are formed in the hole-current generation region and in the peripheral region of the hole-current generation region, such that light beams incident upon the peripheral region can be more effectively prevented from being introduced into the hole-current generation region. That is, when only one microlens 344 is used as shown in FIG. 2, light incident upon the peripheral region may be refracted toward the hole-current generation region by the microlens 344. However, when different microlenses are formed in the hole-current generation region and in the peripheral region as shown in FIG. 7, light beams incident upon the peripheral region may be separately converged by microlenses formed in the peripheral region so that the converged light beams are not refracted toward the hole-current generation region.

Figure 9A:
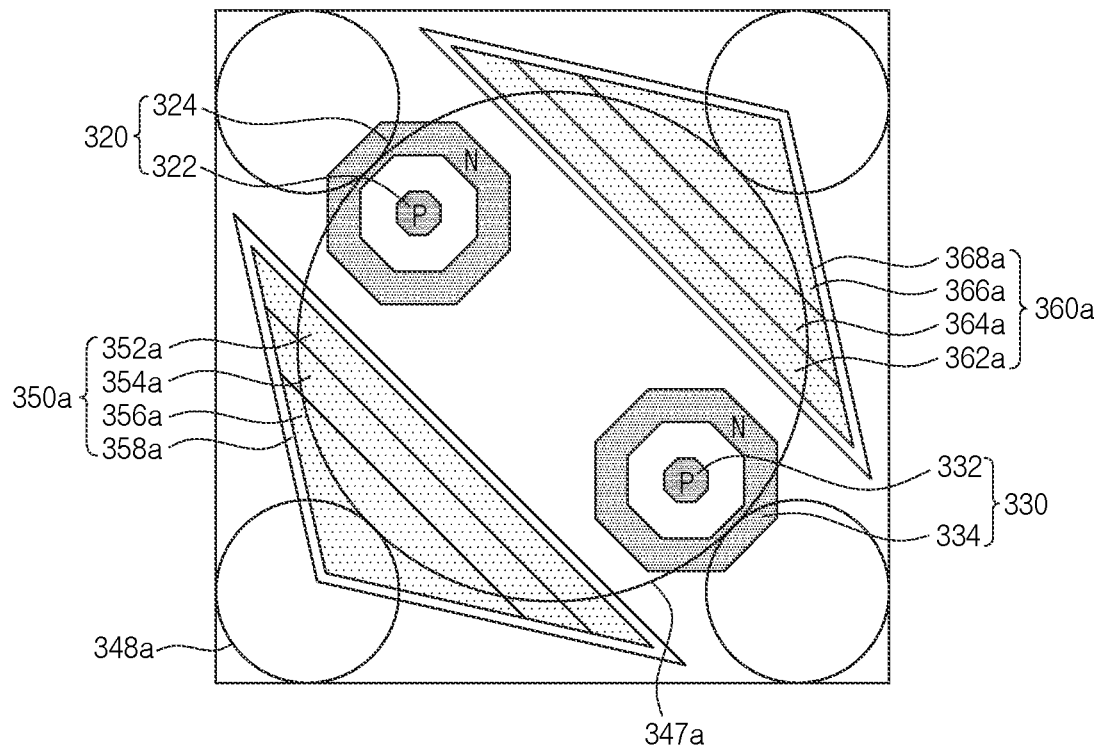
FIGS. 9A and 9B are plan views illustrating examples of a unit pixel formed in a pixel array shown in FIG. 1 based on still another embodiment of the disclosed technology.
Figure 9B:
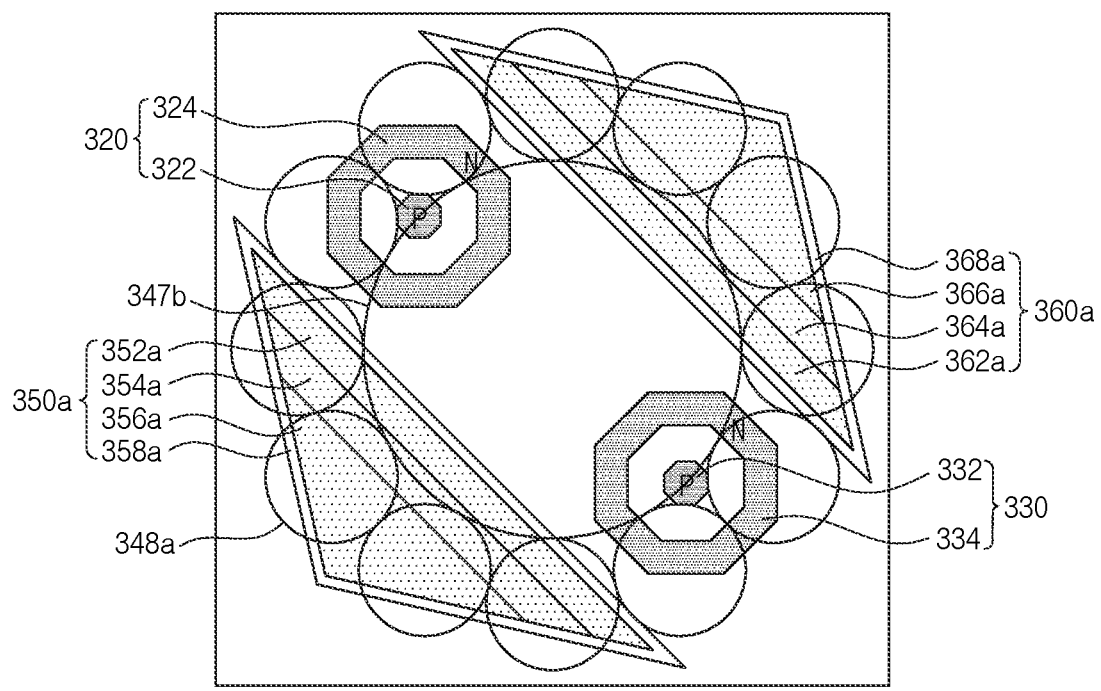

Although FIG. 7 illustrates that the microlenses 346 are formed to have the same size, other implementations are also possible. For example, the microlenses 346 may also have different sizes based on positions of the microlenses 346. For example, as shown in FIGS. 9A and 9B, larger microlenses (i.e., main microlenses) 347a and 347b may be formed at a specific position vertically overlapping the hole-current generation region, and smaller microlenses (i.e., sub-microlenses) 348a and 348b smaller than the main microlenses 347a and 347b may be formed in a peripheral region around corners of the unit pixel.

Figure 10A:
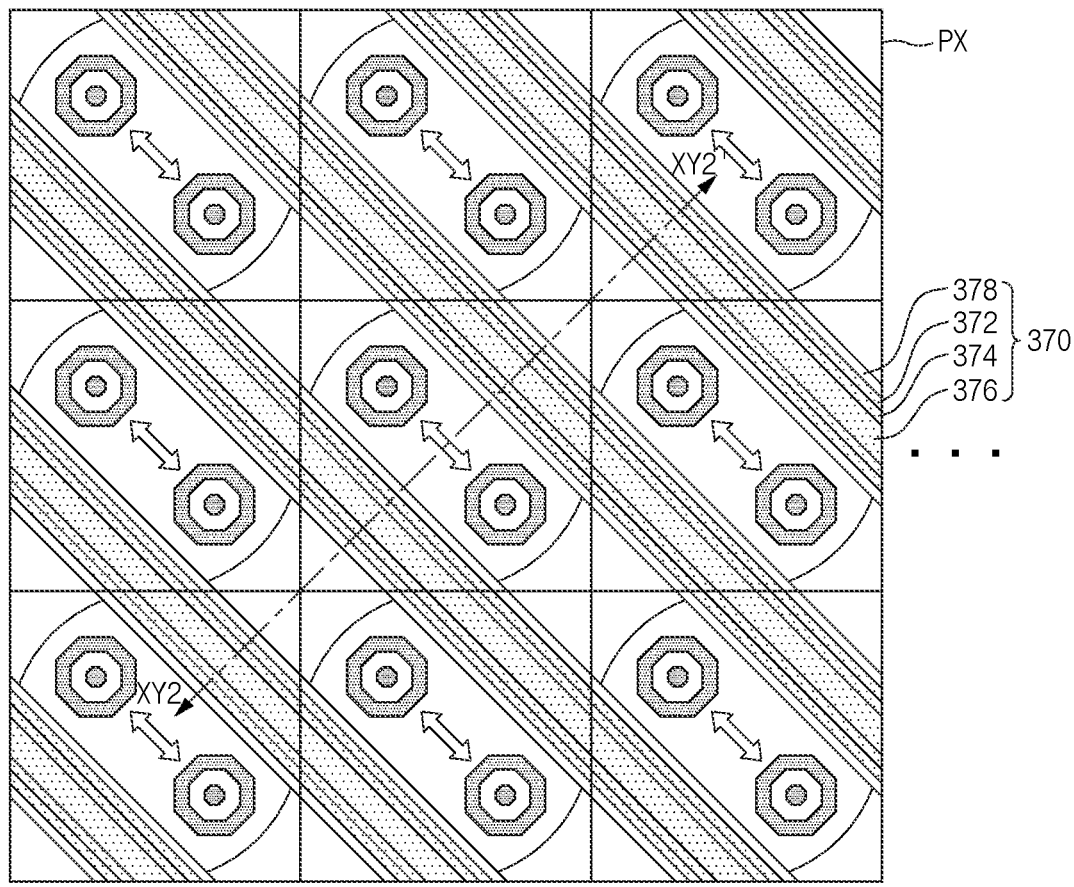
FIG. 10A is a plan view illustrating an example of the pixel array shown in FIG. 1 based on some embodiments of the disclosed technology.
Figure 10B:
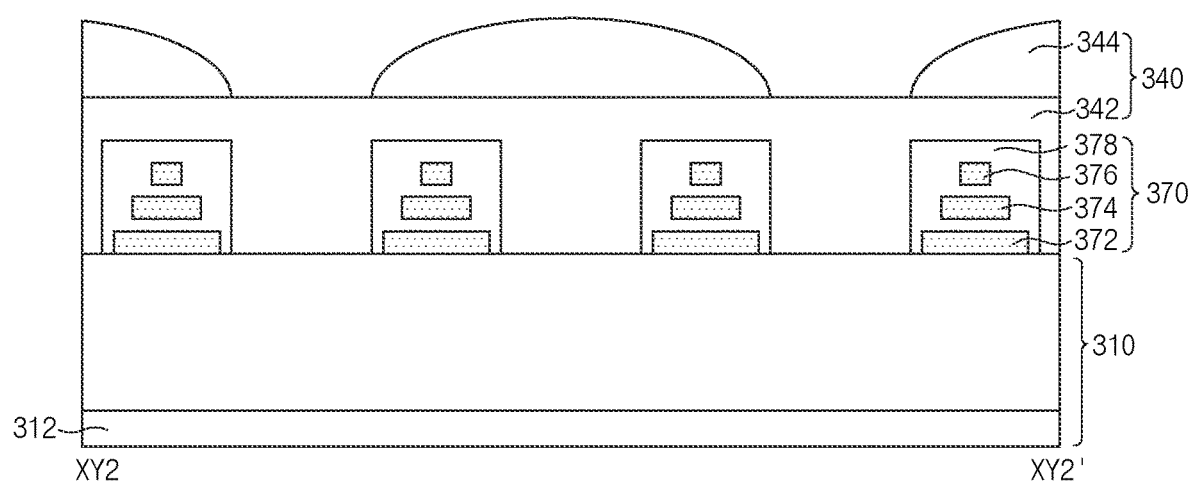
FIG. 10B is a cross-sectional view illustrating an example of the pixel array taken along the line XY2-XY2' shown in FIG. 10A based on some embodiments of the disclosed technology.

FIG. 10A is a plan view illustrating an example of the pixel array shown in FIG. 1. FIG. 10B is a cross-sectional view illustrating an example of the pixel array taken along the line XY2-XY2' shown in FIG. 10A.

Referring to FIGS. 10A and 10B, a noise blocking structure 370 may be formed in a straight line shape that extends in a diagonal direction in a manner that the noise blocking structure 370 extends across by the plurality of unit pixels (PXs) that is diagonally adjacent to each other in the pixel array 300. Although the above-mentioned embodiments have disclosed that the first noise blocking structures 350a~350d and the second noise blocking structures 360a~360d are separated from each other for each unit pixel (PX), other implementations are also possible. The noise blocking structure 370 shown in FIGS. 10A and 10B may extend in a line shape in a manner that the noise blocking structure 370 overlaps with the plurality of unit pixels (PXs).

As described above, the noise blocking structure 370 is formed in a line shape to overlap with the plurality of unit pixels, such that a fabrication process of the noise blocking structure 370 can be simplified and the shielding effects can be further strengthened.

The noise blocking structure 370 may include a plurality of shielding layers 372, 374, and 376 having different widths while being stacked in the height direction, and a capping layer 378 formed to cover the shielding layers 372, 374, and 376. In this case, each of the shielding layers 372, 374, and 376 may be formed in a line shape, and the shielding layers 372, 374, and 376 having different widths may be stacked in a manner that the center lines of the shielding layers 372, 374, and 376 overlap with each other in a vertical direction. For example, the shielding layers 372, 374, and 376 may be stacked in a shape in which the shielding layers 372, 374, and 376 are gradually smaller in width in an upward direction. Therefore, both side parts of the noise blocking structure 370 may be formed in a stacked shape in which the shielding layers are stacked in a shape of stairs.

As is apparent from the above description, the image sensing device based on some implementations of the disclosed technology can improve the accuracy of data sensing by blocking noise introduced into the substrate in a Current-Assisted Photonic Demodulator (CAPD) pixel structure.

Although a number of illustrative embodiments of the disclosed technology have been described, various modifications or enhancements to the disclosed embodiments and other embodiments can be devised based on what is described and/or illustrated in this patent document.

What is claimed is:

1. An image sensing device, comprising:
   a pixel array in which a plurality of unit pixels is consecutively arranged, wherein each of the plurality of unit pixels includes:
      a substrate structured to include a sensing region that generates charge carriers in response to incident light;
      first and second signal detectors formed in the sensing region of the substrate and configured to receive control signals for generating a charge current in the sensing region of the substrate and capture the charge carriers moving by the charge current;
      a lens layer formed over the substrate to direct incident light toward the substrate in a unit pixel; and
      noise blocking structures disposed over a peripheral region of the sensing region and between the substrate and the lens layer, the noise blocking structures being structured to leave space above the sensing region open to allow the incident light from the lens layer to reach the sensing region while shielding the peripheral region of the sensing region in the substrate from the incident light,
      wherein the noise blocking structures are disposed on two sides of the sensing region in each unit pixel, and
      wherein noise blocking structures disposed on two sides of the sensing region in a first unit pixel are separated from noise blocking structure disposed on two sides of the sensing region in a second unit pixel adjacent to the first unit pixel.

2. The image sensing device according to claim 1, wherein the noise blocking structures include:
   a first noise blocking structure and a second noise blocking structure that are spaced apart from each other by a predetermined distance in a direction perpendicular to a direction of the charge current.

3. The image sensing device according to claim 2, wherein:
   the first noise blocking structure and the second noise blocking structure are formed symmetrical to each other in the direction perpendicular to the charge current.

4. The image sensing device according to claim 1, wherein each of the noise blocking structures includes:
   a plurality of shielding layers stacked one another; and
   a capping layer covering the plurality of shielding layers.

5. The image sensing device according to claim 4, wherein:
   the plurality of shielding layers include a first shielding layer, a second shielding layer and a third shielding layer that are stacked in an order in a direction further away from the substrate, the first shielding layer having a size greater than that of the second shielding layer greater than that of the third shielding layer.

6. The image sensing device according to claim 4, wherein:
   each of the plurality of shielding layers has an inner sidewall and an outer sidewall, the inner sidewall relatively closer to an center of the unit pixel and the outer sidewall relatively closer to an edge of the unit pixel, and outer sidewalls of the plurality of shielding layers are aligned.

7. The image sensing device according to claim 4, wherein:
   each of the plurality of shielding layers has a shape extending in the direction of the charge current.

8. The image sensing device according to claim 4, wherein:
   each of the plurality of shielding layers includes a curved shape.

9. The image sensing device according to claim 4, wherein:
   the plurality of shielding layers includes a material that absorbs light.

10. The image sensing device according to claim 4, wherein:
the capping layer includes a material that has a refractive index different from that of the lens layer.

11. The image sensing device according to claim 1, wherein the first and second signal detectors include:
first and second control regions spaced apart from each other by a predetermined distance in the substrate, and configured to generate the charge current in the substrate using a potential difference;
a first detection region formed in the substrate to surround the first control region, and configured to capture the charge carriers moving toward the first control region by the charge current; and
a second detection region formed in the substrate to surround the second control region, and configured to capture the charge carriers moving toward the second control region by the charge current.

12. The image sensing device according to claim 1, wherein the lens layer includes:
an over-coating layer in which the noise blocking structures are disposed; and
at least one microlens formed over the over-coating layer and having a curved surface.

13. The image sensing device according to claim 1, wherein the noise blocking structures are disposed without overlapping with a boundary of the adjacent unit pixels.

14. An image sensing device, comprising:
a pixel array in which a plurality of unit pixels is consecutively arranged,
wherein each of the plurality of unit pixels includes:
a substrate structured to include a sensing region that generates charge carriers in response to incident light;
first and second signal detectors formed in the sensing region of the substrate and configured to receive control signals for generating a charge current in the sensing region of the substrate and capture the charge carriers moving by the charge current;
a lens layer formed over the substrate to direct incident light toward the substrate in a unit pixel; and
noise blocking structures disposed over a peripheral region of the sensing region and underneath the lens layer, the noise blocking structures being structured to leave space above the sensing region open to allow the incident light from the lens layer to reach the sensing region while shielding the peripheral region of the sensing region in the substrate from the incident light,
wherein the lens layer includes:
an over-coating layer in which the noise blocking structures are disposed, and
at least one microlens formed over the over-coating layer and having a curved surface; and
wherein the at least one microlens includes:
a first microlens disposed to vertically overlap with the sensing region, and
a second microlens disposed around a corner of the unit pixel.

15. The image sensing device according to claim 14, wherein the first and second signal detectors include:
first and second control regions spaced apart from each other by a predetermined distance in the substrate, and configured to generate the charge current in the substrate using a potential difference;
a first detection region formed in the substrate to surround the first control region, and configured to capture the charge carriers moving toward the first control region by the charge current; and
a second detection region formed in the substrate to surround the second control region, and configured to capture the charge carriers moving toward the second control region by the charge current.

16. An image sensing device, comprising:
a substrate in which signal carriers are generated in response to incident light;
first and second signal detectors spaced apart from each other by a first predetermined distance in a first direction within the substrate, the first and second signal detectors configured to receive control signals for generating a current in the substrate, and capture the signal carriers moving by the current;
third and fourth signal detectors spaced apart from each other by a second predetermined distance in the first direction within the substrate, the third and fourth signal detectors configured to receive control signals for generating a current in the substrate, and capture the signal carriers moving by the current;
first and second noise blocking structures formed over the substrate at both sides of the first and second signal detectors to be spaced apart from each other by a third predetermined distance in a second direction perpendicular to the first direction, the first and second noise blocking structures included in a first unit pixel; and
third and fourth noise blocking structures formed over the substrate at both sides of the third and fourth signal detectors to be spaced apart from each other by a fourth predetermined distance in the second direction, the third and fourth noise blocking structures included in a second unit pixel adjacent to the first unit pixel,
wherein the first and second noise blocking structures are configured to shield regions on both sides of each of the third and fourth signal detectors in the second direction, and wherein regions on both sides of each of the third and fourth signal detectors in the first direction are exposed by the third and fourth noise blocking structures,
wherein the third and fourth noise blocking structures are configured to shield regions on both sides of each of the first and second signal detectors in the second direction, and wherein regions on both sides of each of the first and second signal detectors in the first direction are exposed by the first and second noise blocking structures,
wherein the first and second noise blocking structures are separated from the third and fourth noise blocking structures.

17. The image sensing device according to claim 16, wherein each of the first, second, third and fourth noise blocking structures includes:
a plurality of shielding layers stacked in a height direction; and
a capping layer formed to cover the plurality of shielding layers.

18. The image sensing device according to claim 17, wherein:
sizes of the plurality of shielding layers decrease in an upward direction.

19. The image sensing device according to claim 16, further comprising:
a lens layer formed over the substrate, and configured to converge the incident light onto the substrate, wherein the lens layer includes:
an over-coating layer in which the first and second noise blocking structures are disposed; and
at least one microlens formed over the over-coating layer and having a curved surface.

20. The image sensing device according to claim 19, wherein the at least one microlens includes: a first microlens disposed to vertically overlapping a center region of a unit pixel; and
a second microlens disposed around a corner of the unit pixel.

\* \* \* \* \*